United States Patent [19]

Thiele

[11] 3,928,776

[45] Dec. 23, 1975

[54] ARRANGEMENT FOR CONTROLLING A THYRISTOR

[75] Inventor: Gerd Thiele, Erlangen-Frauenaurach, Germany

[73] Assignee: Siemens Aktiengesellschaft, Munich, Germany

[22] Filed: Nov. 29, 1974

[21] Appl. No.: 528,492

[30] Foreign Application Priority Data

Dec. 4, 1973 Germany ........................ 2360392
Dec. 20, 1973 Germany ........................ 2363617

[52] U.S. Cl. ..................... 307/252 N; 307/252 UA
[51] Int. Cl.[2] ..................................... H03K 17/60
[58] Field of Search ...... 307/252 UA, 252 N, 252 D

[56] References Cited

UNITED STATES PATENTS

| | | | |
|---|---|---|---|
| 3,165,688 | 1/1965 | Gutzwiller | 307/252 N |
| 3,335,291 | 8/1967 | Gutzwiller | 307/252 UA |
| 3,745,382 | 7/1973 | Hoge | 307/252 N |

*Primary Examiner*—Harold A. Dixon
*Attorney, Agent, or Firm*—Kenyon & Kenyon Reilly Carr & Chapin

[57] ABSTRACT

In a control arrangement for a thyristor, a storage capacitor is coupled, through a rectifier, in parallel with the thyristor, with a firing capacitor, a choke and an auxiliary thyristor coupled in parallel across the storage capacitor and means provided to couple the voltage of the firing capacitor to the control electrode of the thyristor. The energy for controlling the thyristor is taken from the reverse thyristor voltage and the control signal for firing is provided at low power such as through an optically transmission.

9 Claims, 2 Drawing Figures

ARRANGEMENT FOR CONTROLLING A THYRISTOR

BACKGROUND OF THE INVENTION

This invention relates to thyristors in general and more particularly to an improved arrangement for controlling a thyristor.

It is known in the art that thyristors in convertor installations for high voltages, e.g. HVDC convertor installations, can be supplied with the energy required for controlling the thyristor through the use of pulse transformers. The firing pulse for the thyristor is normally applied between the cathode and the control electrode. Since the cathode can be at a high potential and the control circuit is normally near ground potential, pulse transformers are necessary to maintain isolation because of the large potential difference.

Arrangements such as those shown in German Pat. No. 1,538,099, German Offenlegungsschrift No. 2,303,495 and Chekoslovakian Pat. No. 478,480, have been developed in which the energy for controlling or firing the thyristor is obtained from the reverse thyristor voltage. In cases such as this, the potential difference existing between the thyristor and the control circuit developing a command is obtained through the use of electromagnetic control signal, e.g. an optical signal. By thus separating the path of the control signal from the circuit used for storing the control energy, the pulse transformer which has normally been used is no longer required.

In the embodiment taught by the Chekoslovakian Pat. No. 478,480, a firing capacitor is discharged through an auxiliary thyristor and the control path of the thyristor to be fired. The firing capacitor, which also acts as a storage capacitor, is charged through a network comprising resistors and capacitors using the anode-cathode voltage of the main thyristor. In addition, a quenching circuit for the auxiliary thyristor is included comprising a reversing choke and a quenching capacitor. The quenching circuit is designed as a resonant cirucit and must be damped. For this purpose, high resistance resistors are provided, one of which is coupled parallel to the firing path of the thyristor. With this arrangement the period of the resonant circuit can be adjusted so that the firing capacitor is only partially discharged when the thyristor is fired so the auxiliary thyristor is extinguished prior to the former's full discharge. However, energy is consumed in this process in the damped resonant circuit thereby reducing the efficiency of the firing arrangement. Furthermore, the spacing of successive firing pulses for the thyristor is determined by the properties of the auxiliary thyristor and the quenching circuit.

In the device disclosed in German Offenlegungsschrift No. 2,302,495, a storage capacitor is connected in series with the main thyristor to be controlled through a charging diode or rectifier. The storage capacitor is shunted by a series circuit including a switching device and a firing capacitor. The switching device couples the firing capacitor to the control electrode of the thyristor. In this arrangement the storage capacitor is charged through a voltage divider with the cut-off voltage being the charging voltage. The switching device comprises an elaborate transistor circuit. This circuit permits the firing capacitor to be briefly coupled to the control electrode of the thyristor. Alternatively, a storage capacitor is provided which is continuously connected to the thyristor voltage and which is capable of being coupled to the firing capacitor through the thyristor circuit. In this arrangement no power losses occur in the firing circuit and firing pulses can be coupled from the firing capacitor through the switching device to the thyristor at any time without the need to be concerned about pauses required by the nature of the circuit components. However, an elaborate control is necessary for the transistors in this arrangement. The circuit is furthermore limited to lower thyristor voltages because of the operating voltages which the transistors can withstand. In addition, elaborate protective measures for the transistors are necessary.

Thus, it can be seen that there is a need for an arrangement of this general nature, having the advantages of eliminating the pulse transformer and using the thyristor energy for firing purposes without a requirement for an elaborate electronic switching device.

SUMMARY OF THE INVENTION

The present invention solves this problem by using an auxiliary thyristor as the switching device. The series circuit shunted across the storage capacitor contains a choke and means are provided to fire the auxiliary thyristor automatically as a function of the voltage across the firing capacitor.

In the arrangement of the present invention, the auxiliary thyristor is fired when the voltage at the firing capacitor falls below a given value. Thereby it is automatically assured that sufficient energy for firing the thyristor is always available. The auxiliary thyristor is automatically extinguished after the firing capacitor is charged by the reversal of the series resonant circuit formed by the choke and the firing capacitor. Elaborate electronics are not required either for firing nor quenching of the auxiliary thyristor. As disclosed, the storage capacitor is preferably shunted by a voltage divider comprising a resistor and a constant voltage source with the tap of the voltage divider coupled to the control electrode of the auxiliary thyristor. With this arrangement the auxiliary thyristor is automatically fired in a simple manner as a function of the voltage at the storage capacitor.

DETAILED DESCRIPTION OF THE PREFERRED EMBODIMENT

Figure 1:
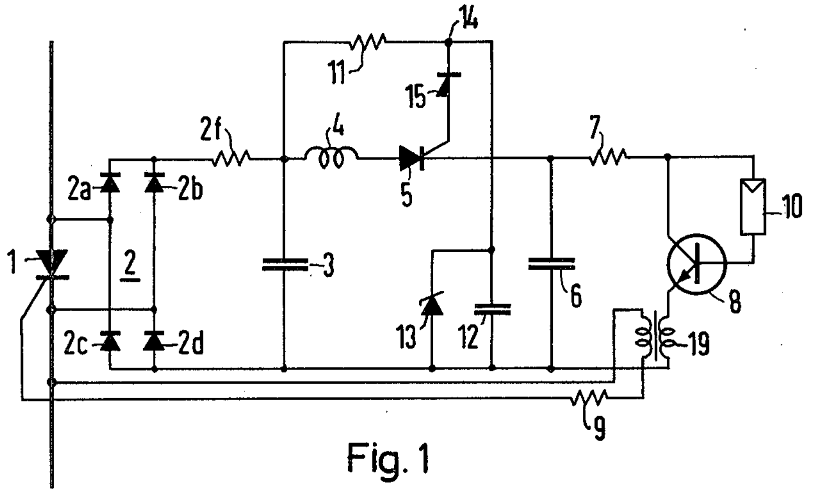
FIG. 1 is a circuit diagram of the first embodiment of the present invention.

FIG. 1 is a circuit diagram illustrating a first embodiment of the present invention. The thyristor which is to be controlled is designated as 1. Across its anode-cathode is a rectifier 2 in the form of a bridge made up of charging diodes 2*a*, 2*b*, 2*c* and 2*d*. The rectifier output is coupled to a limiting resistor 2*f* to a storage capacitor 3. During the period when the thyristor 1 is cut off, the capacitor 3 will be charged with a cut off voltage of the thyristor. In the case of thyristors used in high voltage convertors, a voltage of between 200 and 1000 volts will typically be present at the charged storage capacitor 3. The storage capacitor 3 is shunted by a series circuit comprising a choke 4, an auxiliary thyristor 5 and a firing capacitor 6. Firing of the auxiliary thyristor 5 will result in the coupling of the storage capacitor 3 with the firing capacitor 6 and a transfer of charge to the latter. Typically the relationship between these two capacitors should be selected so as to give a ratio of voltages and of between 1:50 and 1:100. Such may be accomplished by a similar range of capacities. As a result, starting with a voltage such as that mentioned above, i.e. 500 to 1000 volts, a voltage of between 10 and 20 volts can be obtained on the firing capacitor 6. This is the magnitude of voltage generally needed for firing the thyristor 1. The voltage stored at the capacitor 6 is switched to the control electrode of the thyristor 1 using a transistor 8. The collector of the transistor 8 is coupled to one side of the capacitor 6 through a resistor 7. The emitter of the transistor 8 is coupled through the primary of a pulse transistor 19 to the other side of the capacitor. When the transistor 8 is turned on a current pulse will flow through the resistor 7, the collector emitter path of the transistor and the primary of the transformer 19. This will result in a pulse at the secondary of the transformer 19 which is then provided through the resistor 9 to the control electrode of the thyristor 1. The other side of the secondary of transformer 19 is coupled in conventional fashion to the cathode of the thyristor 1. As a result, a firing pulse of appropriate polarity and appropriate voltage will be applied to the thyristor 1 with the energy required for firing coming from the firing capacitor 6. The transistor 8, itself, is controlled by an opto-electric transducer such as a photo diode 10. The diode 10 couples the voltage at the resistor 7 to the base of the transistor 8. When light is impinged thereon by a light source [not shown], it will couple the positive voltage at the resistor 7 to the base forward biasing the transistor and turning it on. In addition, other means of transmission such as h-f transmission may be used. Through this arrangement the thyristor 1 can be fired through the use of an optical signal by means of photodiode 10 without the need for contacts. As a result, the potential difference between the ground potential existing at the device generating firing signals and the cathode potential of the thyristor is bridged with low power. This is a direct result of the control energy being made available by the firing capacitor 6 which, in turn, obtains its energy from the thyristor voltage. Thus, the path of the control signal and the generation and storage of the control energy are separated.

The period of the series resonant circuit comprising the choke 4 and capacitors 3 and 6 should be as small as possible. Since the capacity of the capacitor is determined by the required firing energy and the firing voltage, the inductive choke 4 should be selected to maintain this small period. If an a-c voltage is present at the thyristor 1, then the inductance of the choke must be chosen so that the charging time of the firing capacitor 6 is small as related to the period of the a-c voltage. Typically the inductance should be chosen so that the charging time of the capacitor 6 is no more than 5% of the period of the a-c voltage.

In FIG. 1, the storage capacitor 3 is shunted by a voltage divider comprising resistor 11 and a constant voltage source 13. In this case the constant voltage source 13 is a Zener diode. In parallel with the Zener diode 13 is a capacitor 12. The control electrode of the auxiliary thyristor 5 is coupled to the junction between the resistor 11 and Zener diode 13 at a tap 14. It is coupled through a trigger diode 15. As a result the auxiliary thyristor 5 will be fired automatically when the voltage at the capacitor 6 falls below a value determined by the Zener diode 13. The firing energy from the auxiliary thyristor 5 is supplied by the capacitor 12. With this arrangement the firing capacitor 6 is automatically charged at periodic intervals. This charging is carried out without the need for any separate control device. Once the firing capacitor 6 is charged, the series resonance circuit comprising the firing capacitor 6, the storage capacitor 3 and the choke 4 reverses and the auxiliary thyristor 5 is automatically extinguished in the process. Thus, separate control circuits are needed neither for the firing nor the extinguishing of the auxiliary thyristor 5 and the elaborate electronic arrangements necessary in the prior art are avoided. In addition, separate protective measures for the switching device, i.e. the auxiliary thyristor 5, are not required since the thyristor can be selected for the voltage which will appear at the storage capacitor 3. In lieu of the trigger diode 15, a unijunction transistor may be used instead without affecting the operation of the arrangement.

Figure 2:
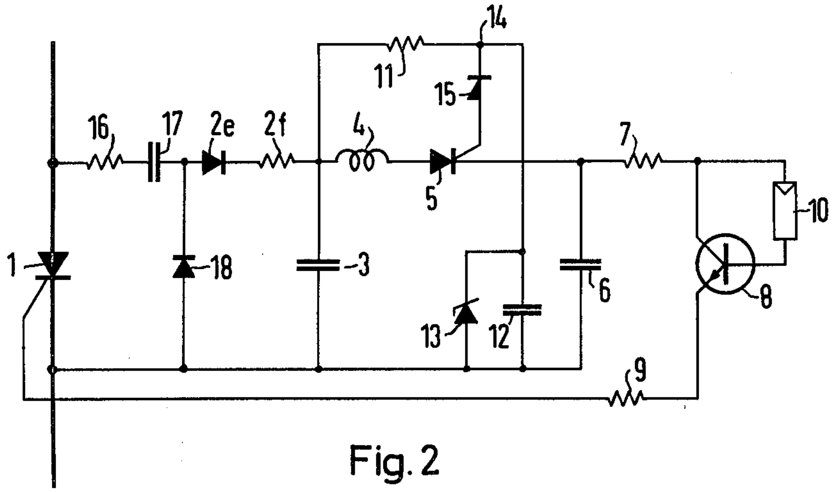
FIG. 2 is a similar circuit diagram of a second embodiment according to the present invention.

FIG. 2 shows an alternate embodiment of the invention which is particularly suited for controlling thyristors in HVDC convertor installations. In this embodiment the bridge 2 is replaced with a voltage doubler circuit. This voltage doubler circuit includes a charging diode 2e preceded by a resistor 16 and a "transfer" capacitor 17. The charging diode 2e and storage capacitor 3 are shunted by a blocking diode 18. The voltage doubling circuit used herein is explained in detail in German Pat. No. 1,538,099. Furthermore, in this embodiment, the emitter of transistor 8 is coupled directly through the resistor 9 to the control electrode of the thyristor 1. This becomes possible because of the use of the voltage doubler circuit in which the other electrode of the firing capacitor 6 is coupled to the cathode of the thyristor 1. This embodiment combines the advantages of the voltage doubler circuit described in the aforementioned German patent with the above mentioned advantages of the present invention.

In place of the storage capacitor illustrated, a capacitive voltage divider can also be used with the firing capacitor 6 shunted across one of the capacitors of this voltage divider. This is an alternate means of obtaining the voltage reduction necessary. Furthermore, the arrangement of the present invention can be supplemented by logic switching elements which will ensure, for example, that the thyristor 1 is fired only when no reverse voltage is applied to it. In the control circuit such as the transistor 8 and photodiode 10 and the associated components providing an input to the photodiode 10, amplifiers and other components can be used in the manner well known in the data communications art. Such can be used both in the circuits used to control the photodiode and in the transistor and photodiode circuit illustrated.

Thus, an improved arrangement for controlling a thyristor in which the thyristor is controlled with a lower power input signal, i.e. through a light signal or an h-f signal, without the need for elaborate electronics to make the control energy available has been shown. Although specific embodiments have been illustrated and described, it will be obvious to those skilled in the art that various modifications may be made without departing from the spirit of the invention which is intended to be limited solely by the appended claims.

What is claimed is:

1. An arrangement for controlling a thyristor in which a series circuit consisting of a charging diode and a storage capacitor is coupled in parallel to the thyristor with the storage capacitor shunted by a series circuit comprising a switching device and a firing capacitor and with means provided for coupling the firing capacitor to the control electrode of the thyristor, the improvement comprising:

a. a switching device in the form of an auxiliary thyristor;

b. a choke in the series circuit shunted across the storage capacitor; and c. means for firing said auxiliary thyristor as a function of the voltage across the firing capacitor.

2. An arrangement according to claim 1 wherein said storage capacitor is shunted by a voltage divider comprising a resistor and a constant voltage source with the tap of said voltage source coupled to the control electrode of the auxiliary circuit, said voltage divider and connection being said means for firing.

3. An arrangement according to claim 2 wherein said constant voltage source is shunted by a capacitor and further including a trigger diode in the connection between said tap and said control electrode.

4. An arrangement according to claim 1 wherein the ratio of the capacity of said storage capacitor to said firing capacitor is in the range of 1:50 to 1:100.

5. An arrangement according to claim 1 wherein the inductance of said choke is such as to result in a period in the resonance circuit of which it is a part which is small relative to the period of the a-c voltage present at the thyristor being controlled.

6. An arrangement according to claim 1 wherein said charging diode comprises a portion of a rectifier bridge, the output of said rectifier bridge being coupled across said storage capacitor and the input of said bridge being coupled across said thyristor being controlled.

7. An arrangement according to claim 1 wherein the charging diode is in series with a resistor and a transfer capacitor and wherein the charging diode and storage capacitor are shunted by a blocking diode.

8. An arrangement according to claim 1 wherein the means for coupling the control electrode of the thyristor to said firing capacitor is operable without contact.

9. An arrangement according to claim 8 wherein said means are means obtaining an input from an optoelectrical transducer.

* * * * *